United States Patent [19]
Brahmbhatt

[11] Patent Number: 5,457,652
[45] Date of Patent: Oct. 10, 1995

[54] LOW VOLTAGE EEPROM

[75] Inventor: Dhaval J. Brahmbhatt, San Jose, Calif.

[73] Assignee: National Semiconductor Corporation, Santa Clara, Calif.

[21] Appl. No.: 222,463

[22] Filed: Apr. 1, 1994

[51] Int. Cl.⁶ ............................ G11C 17/00; G11C 11/34
[52] U.S. Cl. .................. 365/185.06; 365/218; 365/182; 365/185.26; 257/314; 257/315
[58] Field of Search ........................ 365/185, 182, 365/900, 184, 218, 181; 257/314, 315, 317

[56] References Cited

U.S. PATENT DOCUMENTS

| | | | |
|---|---|---|---|
| 4,328,565 | 5/1982 | Harari | 365/185 |
| 4,639,893 | 1/1987 | Eitan | 365/185 |
| 4,698,787 | 10/1987 | Mukherjee et al. | 365/185 |
| 4,959,812 | 9/1990 | Momodomi et al. | 365/185 |
| 5,060,195 | 10/1991 | Gill et al. | 365/185 |
| 5,204,835 | 4/1993 | Eitan | 365/185 |
| 5,243,559 | 9/1993 | Murai | 365/185 |
| 5,309,402 | 5/1994 | Okazawa | 365/218 |
| 5,341,342 | 8/1994 | Brahmbhatt | 365/182 |

FOREIGN PATENT DOCUMENTS 0369676  5/1990  European Pat. Off. .

OTHER PUBLICATIONS

B. J. Woo et al. "A Novel Memory Cell Using Flash Array Contactless EPROM (FACE) Technology", 1990 IEEE, pp. 5.1.1–5.1.3.

B. J. Woo et al. "A Poly–Buffered FACE Technology for High Density Flash Memories" Article–pp. 73, 74 and 5.1.4.

Masao Kuriyama et al. "A 5V–Only 0.6 µm Flash EEPROM with Row Decoder in Triple–Well Structure", 1990 IEEE, pp. 152–155, including pp. 270 and 271.

Primary Examiner—David C. Nelms
Assistant Examiner—Huan Hoang
Attorney, Agent, or Firm—Limbach & Limbach

[57] ABSTRACT

A non-volatile memory system which includes an array of memory cells with each of the cells including a source, drain and intermediate channel and which is suitable for low voltage operation such as battery powered applications. A floating gate is positioned over the channel and a control gate is positioned over the floating gate. The array is formed in a P type well, with the P well being formed in an N type well. The N well is formed in a P type substrate. The system includes circuitry for applying appropriate voltages for programming selected cells, reading selected cells and erasing the cells. The substrate is biased to circuit ground and, in read operations, the N well/P well PN junction is reversed biased. A positive voltage, typically a low level battery-supplied voltage, is applied to the control gate of the selected cell to be read and the source of the selected cell is biased to a negative voltage. The negative voltage applied to the source increases the effective cell gate-source and the drain-source voltages in the read operation so as to compensate for the low level voltage applied to the control gate. The reversed biased PN junction isolates the negative voltage applied to the N type source from the grounded P type substrate.

12 Claims, 4 Drawing Sheets

LOW VOLTAGE EEPROM

BACKGROUND OF THE INVENTION

1. Field of the Invention

The present invention relates generally to electrically programmable, electrically erasable, read only memory (EEPROM) devices and, in particular, to a flash EEPROM suitable for low voltage operation.

2. Background Art

Electrically programmable read only memories are non-volatile memories which utilize a floating gate structure. EEPROM's, or electrically erasable, electrically programmable memories, include memories wherein the cells may be individually programmed and erased. However, this type of EEPROM, commonly referred to as a standard EEPROM, requires a wide range of voltages for programming, reading and erasing and the cells are relatively large.

Flash EEPROMs have been developed which have a smaller cell size then standard EEPROM. Flash EEPROMs have cells that cannot be individually erased, but are erased in bulk.

Referring now to the drawings, FIG. 1A depicts a conventional flash memory cell, commonly referred to as the Intel ETOX cell or simply the ETOX cell. The cell includes a graded N type source region 20 diffused into a P type substrate 22. An N type drain region 24 is also diffused into the substrate 22 so as to define a channel region 22a between the source and drain regions.

A polysilicon floating gate 26 is disposed above the channel 22a and is separated from the channel by a thin (about 100 Å) gate oxide 28. A polysilicon control gate 30 is disposed above the floating gate 26 and is separated from the floating gate by an interpoly dielectric layer 32.

As shown in FIG. 1A, the ETOX flash cell is programmed by applying a programming voltage Vpp (typically +6 to [ml]M]volts) to the drain region 24 and a higher voltage Vgg (typically +10 to +13 volts) to the control gate. The source region is grounded (Vss). Voltage Vpp is usually supplied from an external source and voltage Vgg is usually provided by way of a charge pump type circuit.

The positive charge on the control gate 30 results in avalanche or hot electron injection near the drain 24 and into the polysilicon floating gate 26. As will be explained, a programmed cell has characteristics which differ from an unprogrammed cell.

The conventional ETOX cell is read in the manner shown in FIG. 1B. The source region 20 is grounded (Vss) and an intermediate voltage Vr (typically +1 to +2 volts) is applied to the drain region 24. Voltage Vcc, the primary supply voltage, is applied to the control gate 30. Voltage Vcc is typically +5 volts. In the case where the cell had been previously programmed, the negative charge present on the floating gate will tend to prevent the positive voltage on the control gate 30 from inverting the channel.

Thus, the negative charge effectively increases the threshold voltage of the cell so that the cell will not be rendered conductive by the voltage Vcc applied to the control gate 30. Accordingly, no current flow will take place through the cell.

In the event the cell of FIG. 1B was not previously programmed, the threshold voltage of the cell will be sufficiently low such that the cell will be rendered conductive by voltage Vcc. This will result in current flow through the cell which will be detected by the sense amplifier.

The ETOX cell is erased in the manner depicted in FIG. 1C. The drain region 24 is left open (floating) and control gate 30 is grounded (Vss). Positive voltage Vpp is applied to the source region 20 which results in electrons being drawn off floating gate 26 through the thin gate oxide 28 to the graded source region 20. The mechanism for such removal of electrons is known as Fowler-Nordheim tunneling.

The voltage Vcc applied to the control gate 30 (FIG. 1B) in read operations is typically the primary supply voltage of the memory system. There has been a tendency to reduce the magnitude of Vcc from +5 volts to lower values such as +3 volts so that battery powered operation may be achieved. However, low values of Vcc may be insufficient to adequately drive the memory cells during read operations. In that event, the magnitude of cell current produced when an unprogrammed cell is read may be so small the current cannot be reliably detected by the sense amplifier. Further, low cell current increases the time required to read the cell, a particular disadvantage in high speed memory applications.

It would be possible to increase the voltage Vcc applied to the gate during read operations utilizing a charge pump type circuit. However, the gate voltage must be switched rapidly during read operations for high speed memory applications. Charge pump circuits do not possess sufficient speed to accomplish this task.

The present invention overcomes the above-noted shortcoming of conventional flash memory cells when operated at low supply voltages. Reliable read operations are achieved for supply voltages as low as +3 volts and below. This and other advantages of the present invention will become apparent to those skilled in the art upon a reading of the following Detailed Description of the Invention together with the drawings.

SUMMARY OF THE INVENTION

A non-volatile memory system is disclosed which includes an array of memory cells such as flash memory cells. The memory array includes a semiconductor body of a first conductivity type such as a P type substrate in a preferred embodiment. A first well of a second conductivity type is formed in the body. In a preferred embodiment, this is an N well formed in the P substrate so that the cells will be N channel devices. A second well of the first conductivity type is formed in the first well. In a preferred embodiment, the second well is a P well.

All of the cells are formed in the second or P well and are arranged in an array having a multiplicity of rows and columns. Each cell includes a drain region and a source region of the second conductivity type which are spaced apart from one another to define a channel region therebetween in the second well. A floating gate is disposed over the channel region and is insulated from the channel region, preferably by a gate oxide. A control gate is disposed over the floating gate and is insulated from the floating gate.

The memory system further includes control means for applying voltages to the cells of the array so as to program, read and erase the cells. The control means includes read means for reading selected ones of the cells by applying a reference voltage, such as circuit common, to the semiconductor body or substrate. The read means also functions to apply a first voltage having a first polarity with respect to the reference voltage to the source region of a selected cell. In the preferred embodiment, the source region is N type and the voltage is negative.

The read means also functions to apply a second voltage, of a second polarity opposite the first polarity, to the drain region of the selected cell. Preferably, the second voltage is a positive voltage for N channel cells. A third voltage having the second polarity with respect to the reference voltage, is caused to be applied to the control gate. Again, for an N channel device, the third voltage for reading is a positive voltage.

Because opposite polarity voltages, with respect to the semiconductor body, are applied to the source region and control gate, the applied gate-source and drain-source voltages are increased in magnitude. This is particularly advantageous in those applications where the primary supply voltage is a low battery voltage, with such voltage being applied to the control gate of a cell during a read operation. The gate-source voltage is increased by virtue of the present invention by an amount equal to the magnitude of the negative voltage applied to the source as is the drain-source voltage. The construction of the individual cells of the present invention permits the negative voltage to be applied to the source region.

DETAILED DESCRIPTION OF THE INVENTION

Figure 1A:
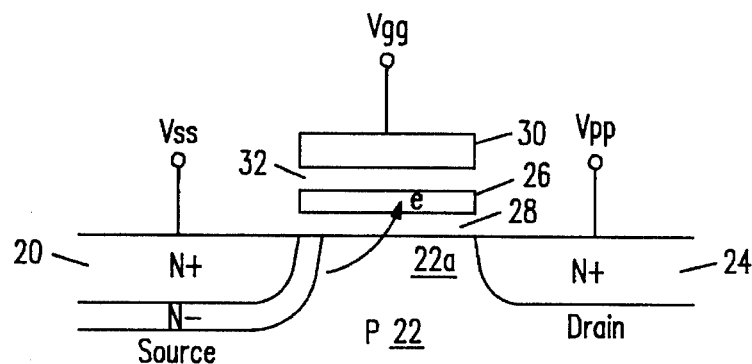
FIGS. 1A–1C depict a conventional flash memory cell with voltages applied for programming, reading and erasing, respectively.
Figure 1B:
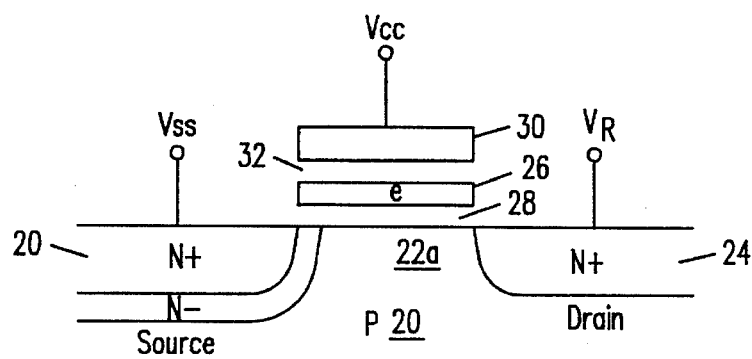
Figure 1C:
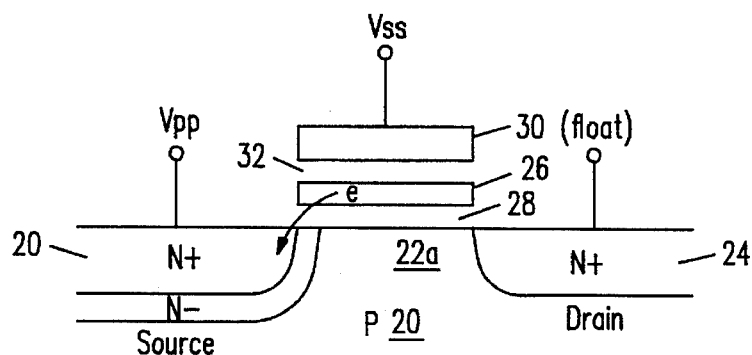
Figure 2A:
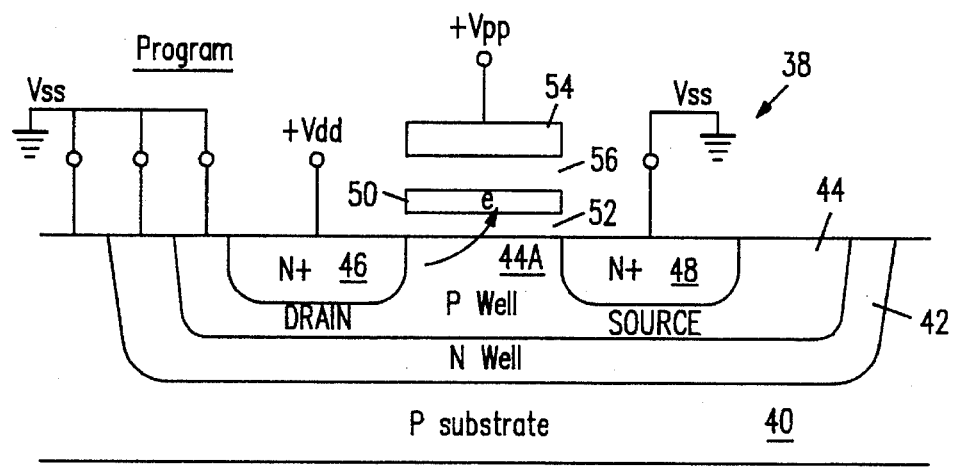
FIGS. 2A–2C depict a cell in accordance with the present invention with voltages applied for programming, reading and erasing, respectively.

Referring again to the drawings, FIG. 2A shows a memory cell, generally designated by the numeral 38, with voltages applied for the purpose of programming the cell. The subject cell is formed in a P type substrate 40. An N type well 42 is formed in the substrate 40. A P type well 44 is formed within the N type well 42. Wells 42 and 44 are sufficiently large to accommodate all of the individual cells that form the memory array.

An N+ type drain region 46 is formed in well 42 as is an N+ source region 48. A channel region 44A is defined between the source and drain regions in the P type well 44. A polysilicon floating gate 50 is positioned above the channel region 44A. A thin gate oxide of approximately 100 Å thickness is disposed between the floating gate 50 and the channel region 44A.

A polysilicon control gate 54 is positioned over the floating gate 50 and is separated from the floating gate by an interpoly dielectric 56.

The manner in which cell 38 is programmed, read and erased will now be described. The voltages set forth in the following description all assume that the primary supply voltage Vcc is at +3 volts. As shown in FIG. 2A, programming is accomplished by applying positive voltage Vpp of +12 volts to the control gate 54 and grounding (Vss) the source 48. A positive voltage Vdd ranging from +6.5 to +7 volts is applied to the drain 46. The substrate 40, N well 42 and P well 44 are all grounded (Vss).

The above-noted voltages cause hot electron injection, with electrons being attracted on to the floating gate 50. Thus, the cell 38 will be programmed and the cell will have a threshold voltage greater than that of an unprogrammed cell.

Figure 2B:
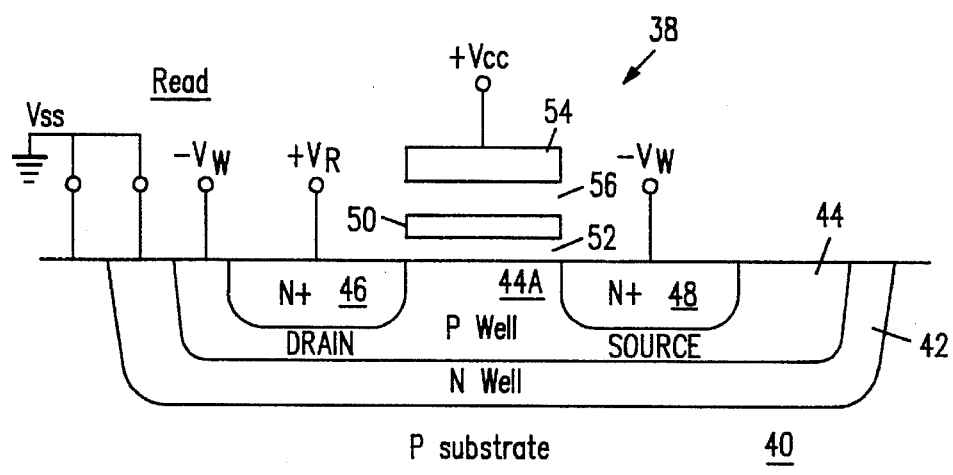

Referring to FIG. 2B, the voltages are depicted for reading cell 38. The supply voltage Vcc of +3 volts is applied to the control gate 54 and a positive voltage +Vr of +1.5 to +2 volts is applied to the drain 46. However, rather than grounding the source 48, the source is coupled to a negative voltage –Vw of –1 to –2 volts. The same negative voltage –Vw is applied to the P well 44. The N well 42 is grounded (Vss).

The effective gate-source voltage applied to cell 38 is increased to equal the sum of the magnitude of the supply voltage Vcc and the magnitude of voltage –Vw, rather than just Vcc. Similary, the drain-source voltage is increased by the magnitude of –Vw. Thus, for even low supply voltages Vcc, such as +3 volts, the gate-source and drain-source voltages will be sufficiently large to insure that the cell is reliably read, i.e., a substantial cell current is produced in a read cycle in the event the cell had not been previously programmed and an insignificant cell current is produced in the event the cell had been previously programmed. A sense amplifier, not depicted, is connected between the drain 46 and a load resistor, also not depicted, for use in reading the cell.

As will be explained, when a particular cell 38 of a memory array is being read, the cells located in other rows of the array will have control gates that are at ground potential (Vss). It is important that these deselected cells not become conductive and thereby interfere with the reading of the selected cell. Accordingly, the negative voltage –Vw should not be made so large that the unprogrammed (erased) threshold voltage of the cell is exceeded causing the deselected cell to become conductive even when the gate is at ground potential.

Figure 2C:
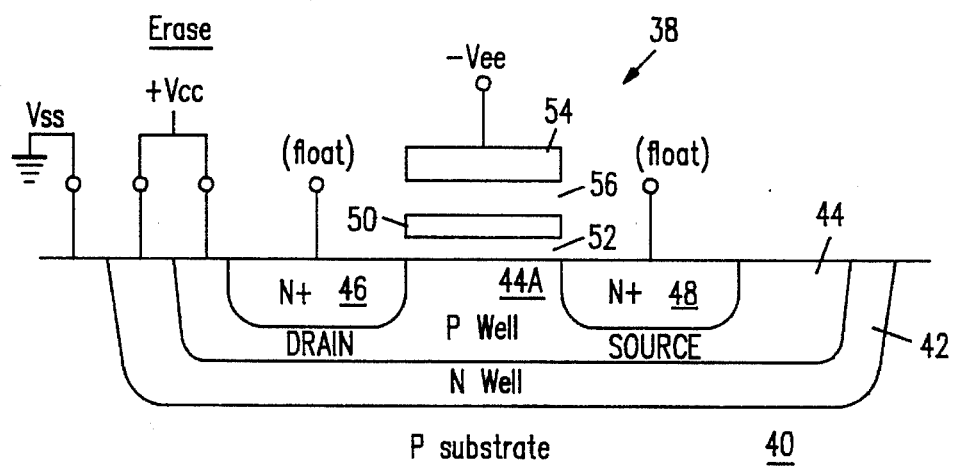

Cell 38 is erased in the manner depicted in FIG. 2C. The drain 46 and source 48 are both left open or floating. The substrate is grounded (Vss) and the P well 42 and N well 44 are both biased to the positive supply voltage +3 volts (Vcc). A negative voltage of –10 volts (–Vee) is applied to the control gate 54.

The voltage difference between the control gate 54 and the P well 44 of 13 volts functions to induce Fowler-Nordheim tunneling thereby causing the electrons to exit the floating gate 50 and enter the positively-biased P well 44. Note that Fowler Nordheim tunneling will occur over the full length of the channel and will not be localized at either the drain or source, such localization being undesirable from a reliability point of view.

Figure 3:
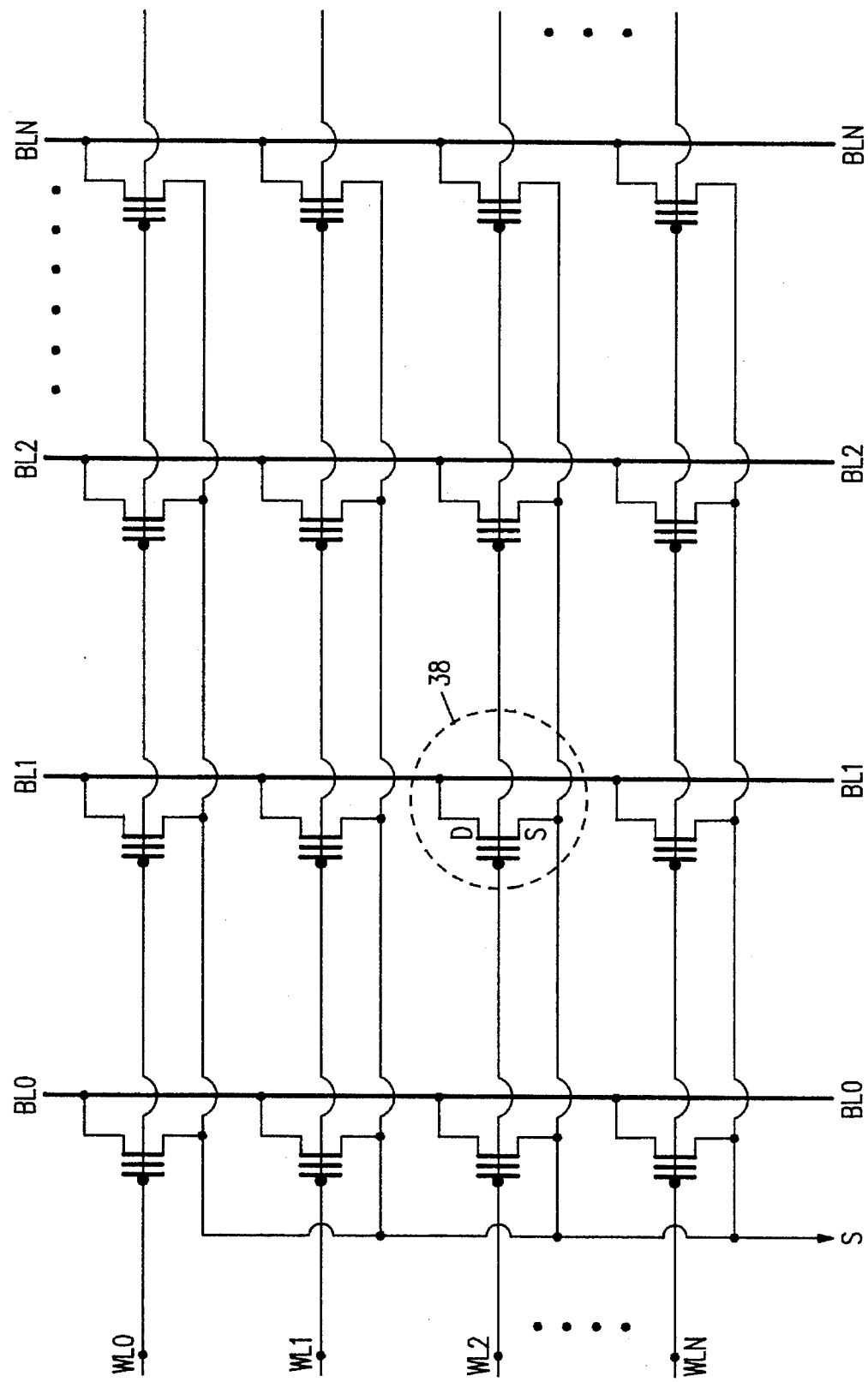
FIG. 3 is a diagram of a cell array, with the cells of the present invention being arranged in rows and columns.

FIG. 3 shows a memory array 58 showing an arrangement of individual cells 38 disposed in horizontal rows and vertical columns. All of cells located in a particular row have their respective common control gates 54 (FIGS. 2A–D) connected together by a word line WLN. All of cells in a particular column have their drains connected to a common bit line BLN. All of the sources for the cells 38 in the array are connected to a common source line S. Frequently, an array is segmented so that all of the cells in a particular segment are connected in common so that each segment has a separate common source line S.

Figure 4:
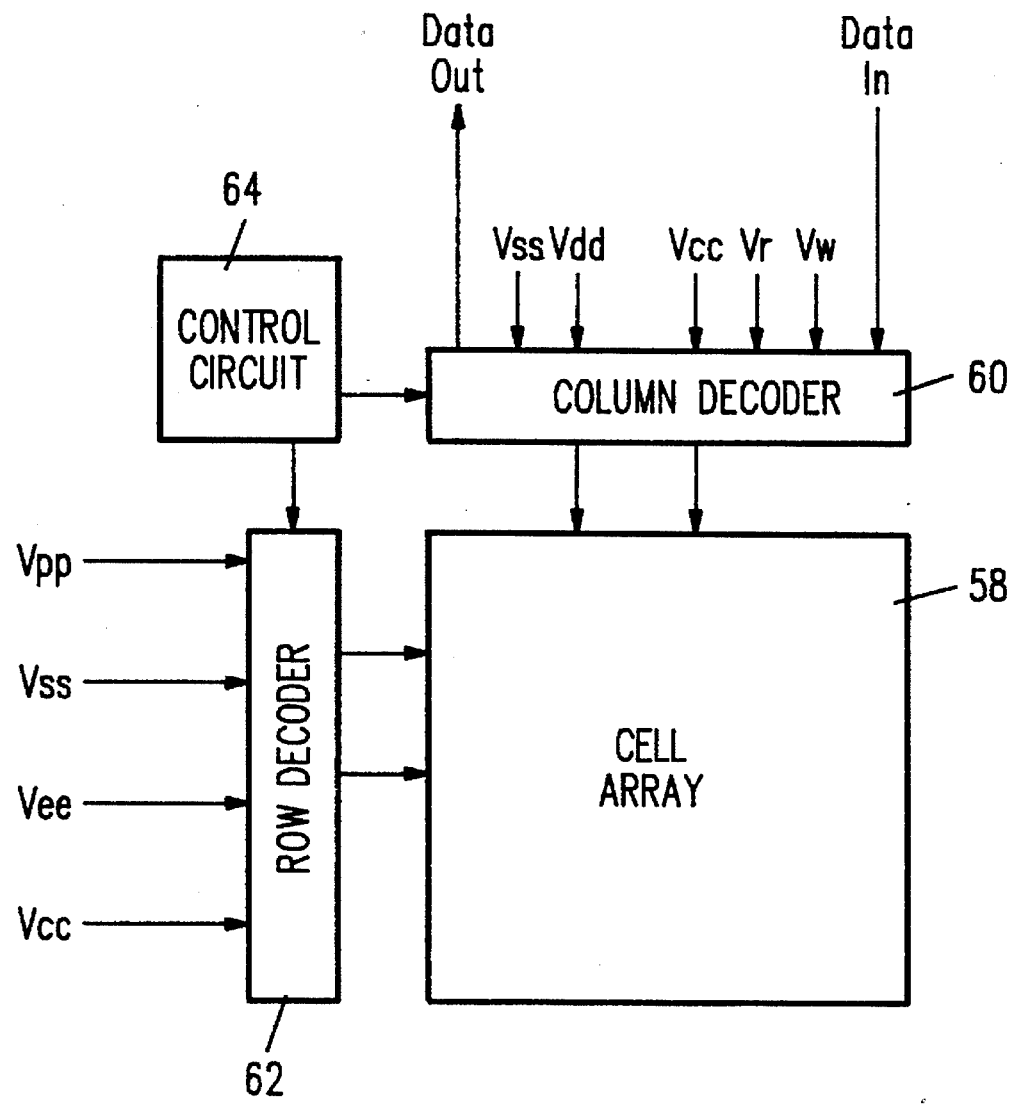
FIG. 4 is an overall block diagram of a memory system of the present invention which depicts the various system components for programming, reading and erasing the cells of the array.

FIG. 4 is a block diagram of a memory system which includes an array 58 comprised of cells 38. The system includes a Column Decoder 60 connected to the bit lines BLN for selectively applying appropriate voltages to the lines so as to carry out the program, read and erase operations. The system also includes a Row Decoder 62 connected to the word lines WLN for selectively applying appropriate voltages to the lines for carrying out the program, read and erase operations.

Both the Column Decoder 60 and the Row Decoder 62 are controlled by a Control Circuit 64 which directs the decoders to perform the program, read and erase operations based upon various Control Circuit inputs (not depicted), including read addresses and write addresses and program, erase and read voltages. The Control Circuit 64 also functions to apply the appropriate voltages to the substrate 40, the N well 42 and the P well 44.

Table 1 below discloses the various voltages to be applied to the word lines WLN, bit lines BLN, source line S, P well 44, N well 46 and substrate 40 for carrying out program, read and erase operations. There are two columns setting forth the programming conditions, the first being for those applications where multiple supplies are used and the second being for those applications where a single supply, such as a single battery, is used. If multiple supplies are used, one supply will provide a positive voltage +Vpp of +12 volts and a second supply will provide positive voltage +Vcc of +3 volts.

TABLE 1

| | Program (multi supply) | Program (single supply) | Erase | Read |
|---|---|---|---|---|
| Selected Word Line | +Vpp (+12 volts) | +Vpp (+12 volts) | −Vee (−10 volts) | +Vcc (+3 volts) |
| Deselected Word Line | Vss (ground) | −Vv (−3 volts to −4 volts) | −Vee (−10 volts) | Vss (ground) |
| Source | Vss (ground) | Vss (ground) | F (open) | −Vw (−1 to −2 volts) |
| Selected Bit Line (Drain) | +Vdd (+6.5 to +7 volts) | +Vcc (+3 volts) | F (open) | +Vr (+1.5 to +2 volts) |
| Deselected Bit Line | F (open) | F (open) | F (open) | F (open) |
| P Well (Body) | Vss (ground) | −Vv (−3 volts to −4 volts) | +Vcc (+3 volts) | −Vw (−1 to −2 volts) |
| N Well | Vss (ground) | Vss (ground) | +Vcc (+3 volts) | Vss (ground) |
| Substrate | Vss (ground) | Vss (ground) | Vss (ground) | Vss (ground) |

Assuming cell 38A of the FIG. 3 array 58 is to be programmed and multiple power supplies are used, Table 1 above indicates that the Control Circuit 64 will direct the Row Decoder 62 to cause voltage +Vpp to be applied to the selected word line, WL2, of cell 38A. In addition, Row decoder will be directed to ground the deselected word lines WL0, WL1 and WLN.

In addition, the Control Circuit 64 will direct the Row Decoder 62 to ground the common source line S connected to the source of all cells 38. In addition, Circuit 64 will cause voltage +Vdd to be applied to bit line BL1 connected to the drain of cell 38A. Note that voltage +Vdd is typically derived from the +12 volt supply that provides +Vpp. The remaining or deselected bit lines BL0, BL2 and BLN are left floating and the P well 44, N well 42 and substrate 40, all of which are common to all the cells of the array 58, are all grounded by the Control Circuit 64.

As explained in connection with FIG. 2A, the above described conditions are appropriate for programming selected cell 38A. The cells located in deselected rows all have word lines with are grounded therefor such cells will not be programmed. With respect to the deselected cells connected to selected word line WL2, these cells all have floating drains and therefor will not be programmed.

The erase conditions of Table 1 function to erase the cells in the same manner previously described in connection with FIG. 2B. If all the cells are to be erased, the conditions of Table 1 are applicable. However, if only one row of cells is to be erased, voltage −Vee is applied only to the word line of that row, with the remaining word lines of the deselected rows being grounded (Vss). The remaining conditions set forth in Table 1 still apply. Note that negative voltage −Vee is typically generated on-chip utilizing a negative voltage charge pump.

The conditions for reading selected cells are set forth in Table 1. Assuming, for example, that cell 38A is to be read, the selected word line WL2 is brought up to voltage +Vcc and the remaining word lines WL0, WL1 and WLN are grounded. The common source line S is brought down to −Vw and bit line BL1 connected to the drain of cell 38A is brought up to voltage +Vr by way of a load impedance (not shown) connected to voltage Vcc. A sense amplifier (not depicted) is also connected to bit line BL1. In addition, the P well 44 common to all of the cells of the array is also brought down to −Vw. The substrate 42 and N well 44 are both grounded. The deselected bit lines BL0, BL2 and BLN are all left floating.

In the event a single supply is to be used, such as a battery, the supply is implemented to provide voltage +Vcc of +3 volts, a relatively low supply voltage. The voltages for erasing and reading are the same both for single and multiple supply operation. However, the voltages for programming are preferably different. As can be seen in Table 1, programming is carried out by applying voltage +Vpp to the selected word line. However, voltage +Vpp is produced utilizing an on-chip high voltage charge pump. Since the word lines do not draw a large amount of current, the use of a charge pump for this application does not present a problem.

For single supply operation, a negative voltage −Vv of −3 to −4 volts is applied to the deselected word lines and also to the P well 44 of the cell. Voltage +Vcc is applied to selected bit line (drain) BL1 and the source line S, the N well 42 and the substrate 40 are all grounded.

It is important to note that in read operations where speed is critical to the overall speed of the memory system, the voltages applied to the word lines must be rapidly switched between +Vcc and ground (Vss) during multiple read operations. The desired high speed switching can be achieved in part because the use of charge pump type circuitry is not necessary for generating the low voltage +Vcc used in this aspect of the read operations. Further, reading speed is not hindered by the use of a charge pump to produce the negative voltage −Vw applied to the source line S (Table 1) since this voltage need not be switched between read operations.

The process for fabricating the subject memory system is conventional and forms no part of the present invention. Accordingly, in order to avoid obscuring the true nature of the present invention in unnecessary detail, the fabrication process will not be described.

Thus, a novel memory system is disclosed capable of reliably operating at low voltages. Although a preferred embodiment has been described in some detail, it will be apparent to those skilled in the art that certain changes can be made without departing from the spirit and scope of the invention as defined by the appended claims.

I claim:

1. A non-volatile memory system comprising:
   a memory cell array including
      a P conductivity type substrate;
      an N well of an N conductivity type formed in the substrate;
      a P well of the P conductivity type formed in the N well;
      a group of memory cells disposed in the P well and arranged in an array having a multiplicity of rows and columns, each of said cells including
         (a) a drain region of the N conductivity type;
         (b) a source region of the N conductivity type, spaced apart from the drain region so as to define a channel region in the P well intermediate the source and drain regions;
         (c) a floating gate disposed over the channel region and insulated from the channel region;
         (d) a control gate disposed over the floating gate and insulated from the floating gate; and
   control means for applying voltages to the cells of the array so as to program, read and erase the cells, said control means including
      read means for reading a selected one of the cells by applying a reference voltage to the substrate, a first voltage, having a negative polarity with respect to the reference voltage, to the source region of the selected cell, a second voltage, having a positive polarity with respect to the reference voltage, to the drain region of the selected cell, and a third voltage, having a positive polarity with respect to the reference voltage, to the control gate of the selected cell, and wherein the cells have an erased threshold voltage when erased with a magnitude which is greater than that of the first voltage.

2. The memory system of claim 1 wherein the read means also functions to apply a fourth voltage, having a negative polarity with respect to the reference voltage, to the P well.

3. The memory system of claim 2 wherein the read means also functions to apply the reference voltage to the N well.

4. The memory system of claim 3 wherein the first and fourth voltages have the same magnitude.

5. The memory system of claim 1 wherein the P well and the N well define a PN junction therebetween and wherein the read means applies voltages to the P well and N well such that the PN junction is reversed biased.

6. The memory system of claim 1 wherein the control means further includes erase means for erasing the cells of the array by applying the reference voltage to the substrate, a fifth voltage, having a positive polarity with respect to the reference voltage, to the P well and a sixth voltage, having a negative polarity with respect to the reference voltage, to the control gate of the cells.

7. The memory system of claim 6 wherein the N well and the P substrate define a PN junction and wherein the erase means applies voltages to the N well and the P substrate such that the PN junction is reversed biased.

8. The memory system of claim 7 wherein the erase means causes the fifth voltage to be applied to the N well.

9. A non-volatile memory system comprising:
   a memory cell array including
      a first conductivity type semiconductor body;
      a first well of a second conductivity type, opposite the first conductivity type, formed in the body;
      a second well of the first conductivity type formed in the first well, with first and second well forming a PN junction at an interface between the wells;
      a group of memory cells disposed in the second well and arranged in an array having a multiplicity of rows and columns, each of said cells including
         (a) a drain region of the second conductivity type;
         (b) a source region of the second conductivity type, spaced apart from the drain region, so as to define a channel region in the second well intermediate the source and drain regions;
         (c) a floating gate disposed over the channel region and insulated from the channel region;
         (d) a control gate disposed over the floating gate and insulated from the floating gate; and
   control means for applying voltages to the cells of the array so as to program, read and erase the cells, said control means including
      read means for reading a selected one of the cells by applying a reference voltage to the body, a first voltage, having a first polarity with respect to the reference voltage, to the source region of the selected cell, a second voltage, of a second polarity opposite the first polarity, with respect to the reference voltage, to the drain region of the selected cell, and a third voltage, having the second polarity, with respect to the reference voltage, to the control gate of the selected cell and wherein the read means further applies voltages to the first and second wells so as to reverse bias the PN junction; and
      erase means for erasing the cells of the array by applying the reference voltage to the body, and applying a voltage having the first polarity, with respect to the reference voltage, to the second well and a voltage having the second polarity, with respect to the reference voltage, to the control gate of the cells to be erased.

10. The memory system of claim 9 wherein the cells, when erased, have an erased threshold voltage with a magnitude which is greater than that of the first voltage.

11. The system of claim 9 wherein the body and the first well form another PN junction at an interface of the body and the first well and wherein the erase means applies voltages to the first well and the body so that the another PN junction is reversed biased.

12. The system of claim 11 wherein the first conductivity type is P type and the second conductivity type is N type.

* * * * *